(12) United States Patent
Song et al.

(10) Patent No.: US 11,224,136 B2
(45) Date of Patent: Jan. 11, 2022

(54) DISPLAY DEVICE FOR VEHICLE

(71) Applicant: LG ELECTRONICS INC., Seoul (KR)

(72) Inventors: Seung Hwan Song, Seoul (KR); Han Soo Kim, Seoul (KR); Sang Min Park, Seoul (KR); Se Won Chun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/030,978

(22) Filed: Sep. 24, 2020

(65) Prior Publication Data

US 2021/0022259 A1 Jan. 21, 2021

Related U.S. Application Data

(63) Continuation of application No. PCT/KR2019/016049, filed on Nov. 21, 2019.

(Continued)

(51) Int. Cl.
*B60K 35/00* (2006.01)
*H05K 5/02* (2006.01)
(Continued)

(52) U.S. Cl.
CPC .......... *H05K 5/0217* (2013.01); *B60K 35/00* (2013.01); *B60Q 1/0023* (2013.01); *B60R 1/04* (2013.01); *H05K 5/0017* (2013.01); *B60K 2370/1533* (2019.05); *B60K 2370/42* (2019.05); *B60K 2370/52* (2019.05); *B60K 2370/785* (2019.05); *B60R 2300/20* (2013.01);
(Continued)

(58) Field of Classification Search
None
See application file for complete search history.

(56) References Cited

U.S. PATENT DOCUMENTS 5,432,496 A * 7/1995 Lin .................. B60Q 1/503
340/457
7,413,233 B1 * 8/2008 Jung .................. B60R 11/0235
296/97.7

(Continued)

FOREIGN PATENT DOCUMENTS

CN 105005358 5/2018
KR 101172780 8/2012
(Continued)

OTHER PUBLICATIONS

PCT International Search Report in International Application No. PCT/KR2019/016049, dated Mar. 31, 2020, 2 pages.

*Primary Examiner* — Xanthia C Cunningham
(74) *Attorney, Agent, or Firm* — Fish & Richardson P.C.

(57) ABSTRACT

A display device for a vehicle includes a main body, a guide, and a flexible display. The flexible display is configured to be inserted between a pair of guide plates of the guide. The pair of guide plates are transparent, and an area of the flexible display positioned between the pair of guide plates is configured to vary. The display device allows a front area of the vehicle to be viewed through the transparent guide plates, and allows a rear area of the vehicle to be disposed on the flexible display. The flexible display is configured to be protected by the pair of guide plates and deformed along the pair of guide plates.

20 Claims, 16 Drawing Sheets

Related U.S. Application Data

(60) Provisional application No. 62/778,898, filed on Dec. 13, 2018.

(51) Int. Cl.
*B60Q 1/00* (2006.01)
*B60R 1/04* (2006.01)
*H05K 5/00* (2006.01)
*F16H 19/04* (2006.01)
*F16H 57/021* (2012.01)
*F16H 57/02* (2012.01)

(52) U.S. Cl.
CPC ............ *F16H 19/04* (2013.01); *F16H 57/021* (2013.01); *F16H 2057/02034* (2013.01); *F16H 2057/02082* (2013.01)

(56) References Cited

U.S. PATENT DOCUMENTS

| | | | | |
|---|---|---|---|---|
| 7,869,129 | B2 * | 1/2011 | Lebreton | B60K 35/00 |
| | | | | 359/632 |
| 8,485,486 | B2 * | 7/2013 | Riedel | B60R 11/0235 |
| | | | | 248/317 |
| 10,434,847 | B2 * | 10/2019 | Yoshizumi | B60R 11/0235 |
| 10,613,810 | B2 * | 4/2020 | Wakamoto | B60K 35/00 |
| 2006/0164230 | A1 * | 7/2006 | DeWind | B60K 35/00 |
| | | | | 340/461 |
| 2008/0100548 | A1 * | 5/2008 | Choi | B60R 11/0235 |
| | | | | 345/87 |
| 2011/0042996 | A1 * | 2/2011 | Demma | B60J 1/2077 |
| | | | | 296/98 |
| 2012/0268665 | A1 * | 10/2012 | Yetukuri | B60K 35/00 |
| | | | | 348/837 |
| 2016/0216513 | A1 * | 7/2016 | Uchiyama | B60R 11/0229 |
| 2017/0232908 | A1 | 8/2017 | Jung | |
| 2017/0349098 | A1 * | 12/2017 | Uhm | B60K 35/00 |

FOREIGN PATENT DOCUMENTS

| | | |
|---|---|---|
| KR | 1020150080878 | 7/2015 |
| KR | 1020160070527 | 6/2016 |

\* cited by examiner

DISPLAY DEVICE FOR VEHICLE

CROSS-REFERENCE TO RELATED APPLICATIONS

This application is a continuation of International Application No. PCT/KR2019/016049, filed on Nov. 21, 2019, which claims priority to U.S. Provisional Application No. 62/778,898, filed on Dec. 13, 2018. The disclosures of the prior applications are incorporated by reference in their entirety.

TECHNICAL FIELD

The present disclosure relates to a display device for a vehicle and, more particularly, to a display device for a vehicle that may be installed at a position adjacent to an upper portion of a windshield of the vehicle to display a situation of an inside or an outside of the vehicle.

BACKGROUND

A rear-view mirror installed in a vehicle may reflect a situation behind the vehicle and allows a driver to visually recognize the situation behind the vehicle.

In some cases, the rear-view mirror may be referred to as a back mirror, a room mirror, and the like.

In a passenger car, the rear-view mirror may be affixed to an upper portion of a front window (i.e., windshield), and, in some cases, may be rotatably mounted on the vehicle and may be adjustable to suit a driver's eye level, position, direction, and the like.

The rear-view mirror may enable the driver to see what is behind the vehicle without looking back, but it may block a portion of the front window and interfere the driver's view of the situation in front of the vehicle.

A vehicle may be equipped with various display devices capable of displaying an image and visual information. For example, the various display devices may include a fixed-type display device as well as a variable-type display device.

SUMMARY

The present disclosure describes a display device for a vehicle that may allow an occupant of the vehicle to view through a flexible display and to check a driving situation through the flexible display. The display device may include a guide that protects the flexible display and guides flexible movement of the flexible display.

The present disclosure also describes a display device for a vehicle that may flexibly deform and move a flexible display while minimizing a resistance or a load applied to the flexible display when the flexible display is deformed.

The present disclosure further describes a display device for a vehicle that may reduce power consumption and avoid interference between components when the flexible display is deformed and moved.

The present disclosure further describes a display device for a vehicle in which the left and right balance of a flexible display may be maintained and the coupling between the flexible display and a flexible printed circuit board may be stably maintained when the flexible display is slidingly moved.

According to one aspect of the subject matter described in this application, a display device for a vehicle includes a main body configured to be fixed to the vehicle and disposed at a position adjacent to an upper portion of a windshield of the vehicle, a guide having an upper portion coupled to the main body and a pair of guide plates that are spaced apart from each other and face each other, and a flexible display configured to extend through a space between the pair of guide plates to thereby vary an area of the flexible display positioned between the pair of guide plates. At least a portion of the pair of guide plates is transparent.

Implementations according to this aspect may include one or more of the following features. For example, each of the pair of guide plates may include an upper region that extends toward a front of the vehicle, a curved region that extends from the upper region toward the front of the vehicle and is curved downward relative to the upper region, and a lower region that extends downward from the curved region. The flexible display may be configured to move between a first state in which the flexible display is retracted from the lower region and a second state in which the flexible display is inserted into the lower region through the upper region and the curved region.

In some implementations, an angle between the upper region and the lower region may be greater than 90° and less than 180°. In some examples, an angle of the upper region relative to a horizontal plane may be 45° or less, and an angle of the lower region relative to a vertical plane may be 45° or less. In some examples, a radius of curvature of the curved region may be less than a radius of curvature of each of the upper region and the lower region.

In some implementations, the pair of guide plates may be made of transparent glass or transparent plastic. In some implementations, the pair of guide plates may be parallel to each other and extend along a left-right direction of the main body.

In some implementations, the guide may further include a guide frame fixed to the main body and coupled to left edges, right edges, and lower edges of the pair of guide plates.

According to another aspect, a display device for a vehicle includes a main body configured to be fixed to a ceiling of the vehicle or to a frame of the vehicle that supports a windshield of the vehicle, a pair of guide plates that are spaced apart from each other and face each other, where each of the pair of guide plates includes an upper region and a lower region disposed vertically below the upper region, a guide frame coupled to edges of the pair of guide plates and fixed to the main body, a flexible display configured to extend, through a space between the pair of guide plates, to the upper region or the lower region of the pair of guide plates, a moving body that supports the flexible display and is configured to move the flexible display relative to the main body, and an actuator configured to move the moving body.

Implementations according to this aspect may include one or more of the following features. For example, the display device may further include a controller disposed inside the main body and configured to control the flexible display, and a flexible printed circuit board (FPCB) that connects the flexible display and the controller to each other. The FPCB may include a first flexible region connected to the flexible display through the moving body, a second flexible region located vertically above the first flexible region and connected to the controller, and a third flexible region that is curved and connects the first flexible region to the second flexible region.

In some implementations, the actuator may include a gear rack that extends along a direction parallel to the upper region, at least one gear engaged with the gear rack, and a motor fixed to the moving body and configured to rotate the at least one gear. In some examples, the display device may further include a fixing bracket fixed to the main body, a first sensor disposed at the fixed bracket and configured to detect a position of the moving body, and a second sensor that is disposed at the fixing bracket, that is disposed forward relative to the first sensor, and that is configured to detect the position of the moving bod. The motor may be configured to be controlled based on a signal detected by the first sensor or by the second sensor.

In some implementations, the display device may further include a third sensor that is disposed at the fixing bracket between the first sensor and the second sensor and configured to detect the position of the moving body, and a fourth sensor that is disposed at the fixing bracket between the second sensor and the third sensor and configured to detect the position of the moving body. The motor may be configured to decelerate a rotation speed of the motor based on a signal detected by the third sensor or by the fourth sensor.

In some examples, each of the first sensor, the second sensor, the third sensor, and the fourth sensor may include a light emitter configured to emit light and a light receiver configured to receive the light emitted from the light emitter, and the moving body may include a wing configured to move between the light emitter and the light receiver.

In some implementations, the actuator may include a first gear rack that extends along a direction parallel to the upper region, a second gear rack that is spaced apart from the first gear rack and extends in parallel to the first gear rack, a first gear engaged with the first gear rack, a second gear engaged with the second gear rack, a drive shaft that defines rotation axes of the first gear and the second gear, a third gear coupled to the drive shaft and disposed between the first gear and the second gear, and a motor fixed to the moving body and configured to rotate the third gear.

In some implementations, the display device may include a first bearing disposed adjacent to the first gear and coupled to the drive shaft, a second bearing disposed adjacent to the second gear and coupled to the drive shaft, and a motor casing that defines a first seating part that supports the first bearing, a second seating part that supports the second bearing, and a receiving space that receives the motor and the third gear.

In some implementations, the display device may include a motor controller disposed in the main body and a motor cable that connects the motor to the motor controller, and the motor cable may include a first cable region located vertically above the drive shaft, a second cable region located vertically below the drive shaft, and a third cable region that is curved and connects the first cable region to the second cable region.

According to another aspect, a display device includes a main body configured to be fixed to the vehicle and configured to be disposed at a position adjacent to an upper portion of a windshield of the vehicle, a pair of guide plates that are transparent, that extend downward from the main body, and that are spaced apart from each other and face each other, a flexible display configured to extend through a space between the pair of guide plates to thereby vary an area of the flexible display overlapping with the pair of guide plates, an actuator configured to move the flexible display, a driving detection sensor configured to detect a driver of the vehicle, and a controller configured to control the flexible display and the actuator based on a driving state of the vehicle or a signal from the driving detection sensor.

Implementations according to this aspect may include one or more of the following features. For example, at least a portion of the pair of guide plates may have a curved shape, and the display device may further include a guide frame that is coupled to left edges, right edges, and lower edges of the pair of guide plates. In some implementations, the flexible display may be a transparent display.

In some implementations, a display device for a vehicle may be switch between a first state and a second state. In the first state, most of the pair of transparent guide plates may not overlap with the flexible display. Accordingly, the pair of guide plates and the flexible display do not block or obstruct the view of the occupant. In the second state, most of the pair of transparent guide plates may overlap with the flexible display, in which case an image may be displayed on the flexible display. In particular, an image outside the vehicle or an image inside the vehicle that is captured by the camera may be displayed on the flexible display. Accordingly, the driving situation may be checked through the flexible display. In addition, the pair of guide plates may protect both sides of the flexible display to help to prevent damage to the flexible display, and guide the flexible movement of the flexible display.

In some implementations, the flexible display may reciprocate flexibly along the inner surfaces of the pair of guide plates, thereby ensuring reliability when the flexible display is deformed.

In some implementations, the upper region of the pair of guide plates may be flat along the front-back direction (horizontal direction), or may have an angle of 45° or less relative to the horizontal direction. Accordingly, it may be possible to provide a display device for a vehicle in which the height (thickness) of the main body for receiving the flexible display is low (thin).

In some implementations, when the flexible display is in the first state, the flexible display may be placed in the horizontal direction. As the flexible display is switched to the second state, the flexible display may be flexibly deformed and moved along the curved region to smoothly enter the lower region. The flexible display may be stably supported by the pair of guide plates placed on both sides of the flexible display, and may be gradually moved while being flexibly deformed along the pair of guide plates.

In some implementations, when the flexible display reciprocates (slidingly moves) relative to the main body, the controller for controlling the flexible display may remain fixed to one side of the inner surface of the main body rather than moving together with the flexible display. In some examples, the controller and the flexible display may be connected by the flexible printed circuit board. The flexible printed circuit board may include a plurality of flexible regions. Accordingly, when the flexible display is deformed and moved, the flexible display and the flexible printed circuit board may be stably coupled, power consumption may be reduced, and interference between components may be avoided.

In some implementations, the actuator may have a symmetrical shape and include a motor cable that connects the motor to a motor controller and that includes a plurality of cable regions. Accordingly, when the flexible display is slidingly moved, the left and right balance of the flexible display may be maintained, and a stable operation of the flexible display may be achieved.

BRIEF DESCRIPTION OF THE DRAWINGS

FIGS. 2A and 2B also show an example of a main body indicated by a dotted line.

DETAILED DESCRIPTION

Figure 1A:
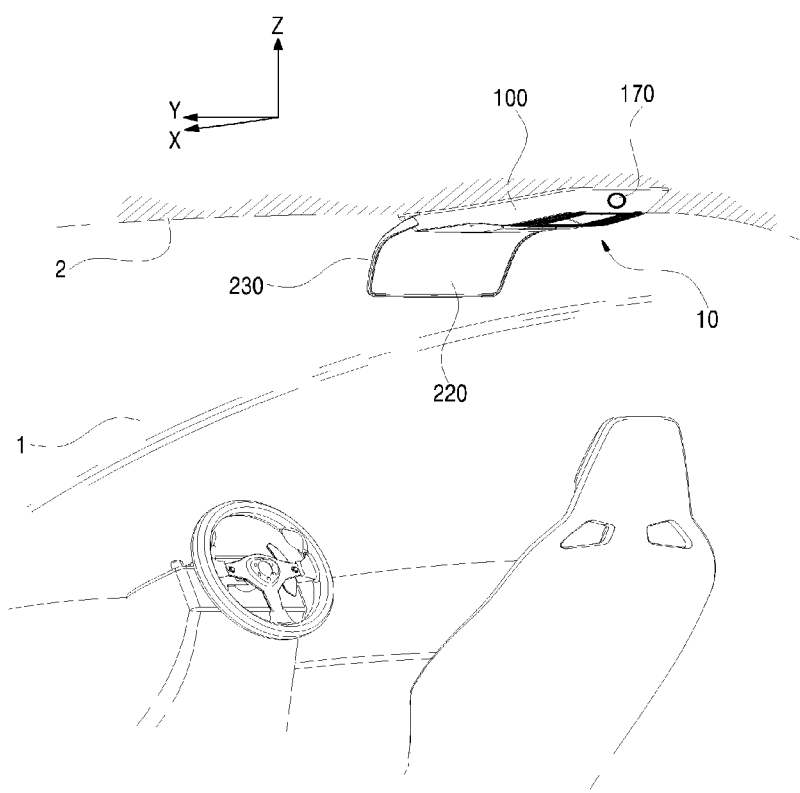
FIG. 1A is a perspective view schematically illustrating an example of a display device for a vehicle installed in an interior of the vehicle.

Hereinafter, one or more implementations of the present disclosure will be described in detail with reference to the accompanying drawings. Like reference numerals will be given to like parts throughout the detailed description.

Each of X, Y, and Z directions shown in the accompanying drawings are orthogonal to one another.

Figure 1B:
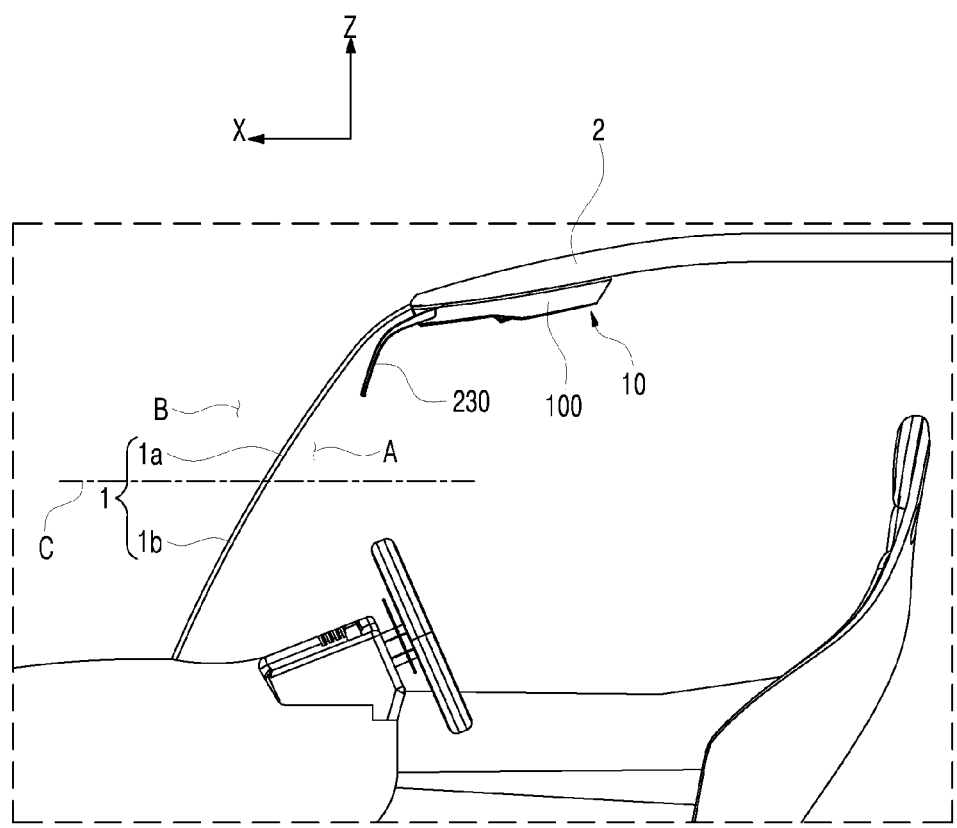
FIG. 1B is a side view schematically illustrating an example of a display device for a vehicle installed in an interior of the vehicle.
Figure 1C:
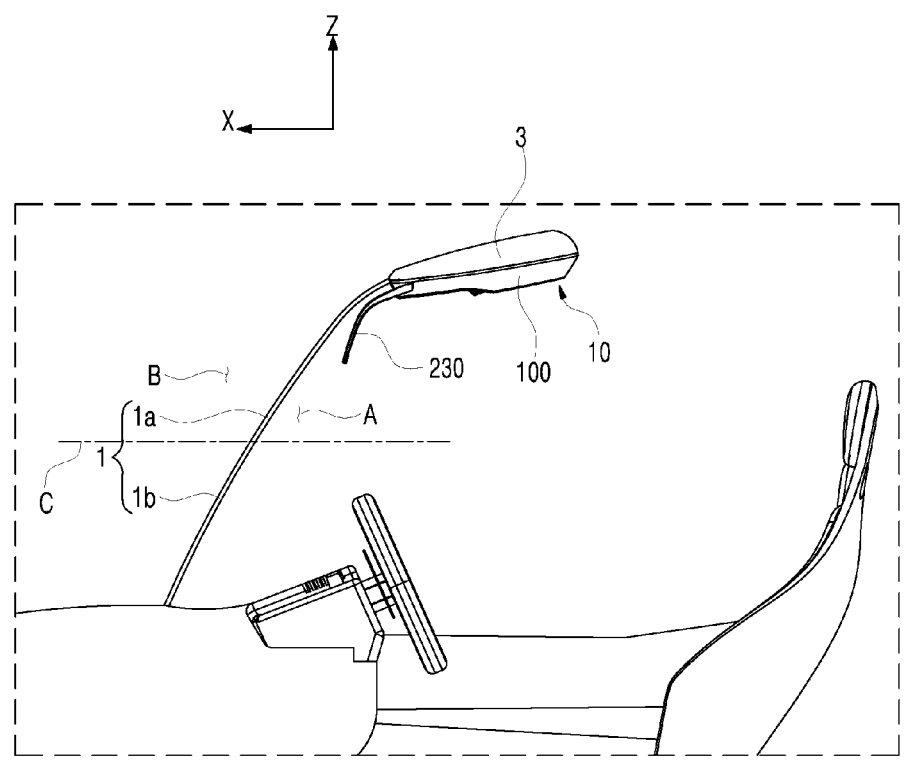
FIG. 1C is a side view schematically illustrating an example of a display device for a vehicle installed in an interior of the vehicle.

FIG. 1A is a perspective view schematically illustrating an example of a display device 10 for a vehicle installed in an interior of the vehicle. FIG. 1B is a side view schematically illustrating the display device 10 installed in an interior of the vehicle. FIG. 1C is a side view schematically illustrating the display device 10 installed in an interior of the vehicle.

Figure 2A:
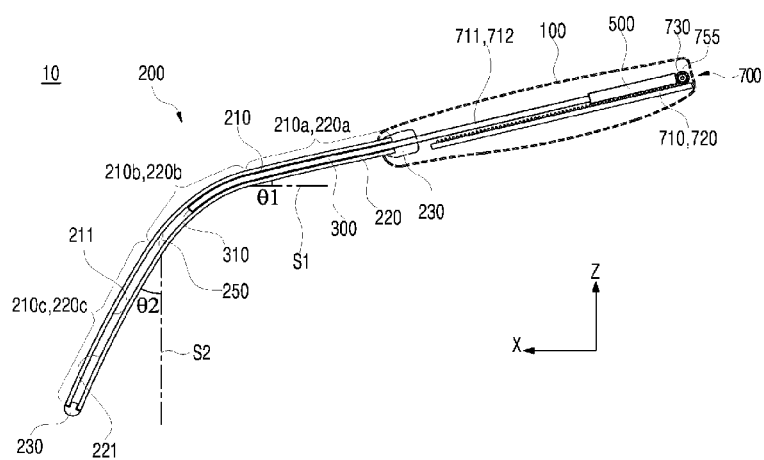
FIG. 2A is a cross sectional view schematically illustrating an example of a first state of an example of a display device for a vehicle.
Figure 2B:
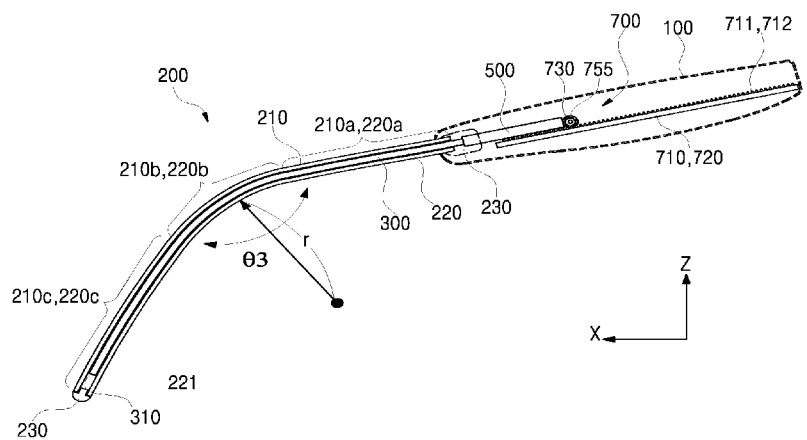
FIG. 2B is a cross sectional view schematically illustrating an example of a second state of the display device of FIG. 2A.

FIG. 2A is a diagram illustrating an example of a first state of the display device 10. FIG. 2B is a diagram illustrating an example of a second state of the display device 10 of FIG. 2A.

Figure 3:
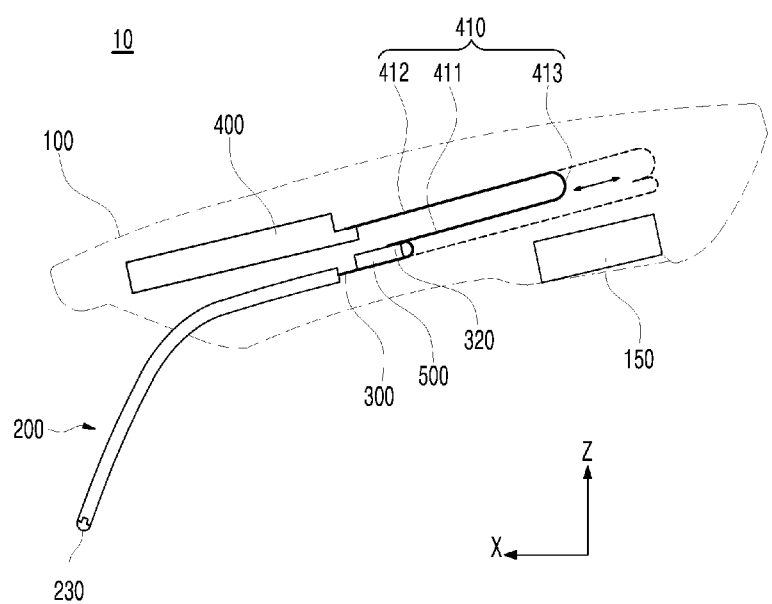
FIG. 3 is a diagram illustrating an example of a first state and a second state of a display device for a vehicle.

FIG. 3 is a diagram illustrating switching between an example of a first state or position and an example of a second state or position of the display device 10.

A flexible display 300 is a display for displaying an image, which may be flexibly bent or curved and elastically deformed. The flexible display 300 may be made of a plastic substrate such that it may be flexibly bent or curved. In some cases, the flexible display 300 may be similar to a typical flexible display. For example, the flexible display 300 may include at least one of a liquid crystal display (LCD), a thin film transistor liquid crystal display (TFT LCD), an organic light emitting diode (OLED), a three-dimensional display (3D display), or an electronic ink display (e-ink display), or other types of flexible displays.

In some implementations, the display device 10 may be installed in the vehicle and configured to display an image and visual information through the flexible display 300 provided in the display device 10. The forward, backward, left, right, upward, and downward directions are defined, in describing the display device 10, based on when the vehicle is in a normal state (for example, a state in which wheels of the vehicle lie on a flat floor in a horizontal direction).

The X direction shown in the figure may be the forward direction, the Y direction may be the left direction, and the Z direction may be the upward direction.

In some implementations, the display device 10 may be installed at a position adjacent to an upper portion of an inner surface of a windshield 1 of the vehicle (a window installed in front of the vehicle). The display device 10 may be installed above a first-row seat of the vehicle or installed slightly forward thereof.

For example, the display device 10 may be located at the inside A of the windshield 1. That is, the display device 10 may be located at the rear side A rather than the front side B with respect to the windshield 1.

In some example, when the windshield 1 is divided into an upper part and a lower part with respect to the central boundary C of the windshield 1, that is, when the windshield 1 is divided into an upper windshield 1a and a lower windshield 1b, the display device 10 may be installed in the vehicle at a position closer to the upper windshield 1a than the lower windshield 1b. The display device 10 may be installed at a position adjacent to the top of the upper windshield 1a.

In some implementations, where the vehicle includes a ceiling 2 that supports the top of the windshield 1, the display device 10 may be installed on the bottom surface of the ceiling 2.

In some implementations, where the vehicle includes a frame 3 that supports the top of the windshield 1, the display device 10 may be installed on the bottom surface of the frame 3.

In some implementations, the display device 10 may be installed in the vehicle by being directly fixed to the upper portion of the windshield 1.

In some implementations, the display device 10 may include a main body 100, a guide 200, and a flexible display 300.

The guide 200 may include a pair of guide plates 210 and 220. In addition, the guide 200 may include a guide frame 230.

The main body 100 may define an overall exterior or housing of the display device 10. The guide 200 and the flexible display 300 are coupled to the main body 100. In addition, respective components constituting the display device 10 may be received inside the main body 100 and coupled to the main body 100.

In some implementations, the main body 100 may be fixed to the ceiling 2 that supports the top of the windshield 1. In some implementations, the main body 100 may be fixed to the frame 3 that supports the top of the windshield 1.

The guide 200 is configured to guide a movement path and direction of the flexible display 300. Further, the guide 200 is configured to support and protect the flexible display 300 that is received in (inserted into) the guide 200. Furthermore, at least a portion of the guide 200 is configured to be transparent, so that the flexible display 300 inserted into the guide 200 may be seen from the outside.

The guide 200 may be in the form of a flat plate as a whole.

The guide 200 may include a flat plate that is bent to have a curved surface.

In some examples, one end of the guide 200 is fixed to the main body 100, and the other end is a free end. In some implementations, the upper portion of the guide 200 is fixed to the main body 100 and the lower portion thereof may be in the form of a free end.

In some examples, the guide 200 may extend forward and downward relative to the main body 100.

In the display device 10, the pair of guide plates 210 and 220 may be a first guide plate 210 and a second guide plate 220.

The first guide plate 210 may be a guide plate that is located relatively forward and upward relative to the second guide plate 220.

The first guide plate 210 and the second guide plate 220 may have substantially the same shape. Each of the first guide plate 210 and the second guide plate 220 may have a shape of a curved plate. Each of the first guide plate 210 and the second guide plate 220 may have a shape of a plate of which the middle portion is bent.

The first guide plate 210 and the second guide plate 220 are spaced apart from each other such that their respective inner surfaces 211 and 221 face each other. Accordingly, a space 250 is formed between the first guide plate 210 and the second guide plate 220. The first guide plate 210 and the second guide plate 220 may be parallel to each other along the left-right direction of the main body 100.

A distance between the first guide plate 210 and the second guide plate 220 may be constant over the entire area of the first guide plate 210 and the second guide plate 220.

The distance between the first guide plate 210 and the second guide plate 220 may be selected to have a size that allows the flexible display 300 to be inserted between the first guide plate 210 and the second guide plate 220. The distance between the first guide plate 210 and the second guide plate 220 may be slightly larger than the thickness of the flexible display 300. In some implementations, when the thickness of the flexible display 300 is t and the distance between the first guide plate 210 and the second guide plate 220 is d, d may be greater than t and less than 2t.

A portion of the flexible display 300 may be inserted between the pair of guide plates 210 and 220. That is, the first guide plate 210 is positioned on one side of the flexible display 300, and the second guide plate 220 is positioned on the other side of the flexible display 300.

An image may be displayed on the flexible display 300.

The flexible display 300 may be configured to display an image on a side thereof that faces the second guide plate 220.

The flexible display 300 may be a transparent display, and an image may thereby be displayed on both sides of the flexible display 300.

In the display device 10, a portion of the flexible display 300 is located inside the main body 100, and the portion of the flexible display 300 that is not located inside the main body 100 is inserted between the pair of guide plates 210 and 220. Accordingly, all surfaces of the flexible display 300 drawn out of the main body 100 may be protected, and the flexible display 300 may be slidingly moved while being flexibly bent along the inner surfaces 211 and 221 of the pair of guide plates 210 and 220.

At least a portion of the pair of guide plates 210 and 220 is configured to be transparent. In some implementations, the pair of guide plates 210 and 220 may be configured to be entirely transparent. In addition, the pair of guide plates 210 and 220 may be formed of transparent glass or transparent plastic, or may be formed of tempered glass.

Accordingly, since the view of the occupant of the vehicle is not disturbed by the pair of guide plates 210 and 220, the occupant may observe the outside of the vehicle through the pair of guide plates 210 and 220.

In the display device 10, the flexible display 300 inserted between the pair of guide plates 210 and 220 is configured to move relative to the pair of guide plates 210 and 220. Accordingly, the area of the flexible display 300 inserted between the pair of guide plates 210 and 220 may vary.

In the display device 10, the area of the flexible display 300 inserted between the pair of guide plates 210 and 220 may be relatively small (for example, the first state or the first position) (see FIG. 2A). In addition, the area of the flexible display 300 inserted between the pair of guide plates 210 and 220 may be relatively large (for example, the second state or the second position) (see FIG. 2B).

The pair of guide plates 210 and 220 may be divided into an upper region 210a and 220a, a curved region 210b and 220b, and a lower region 210c and 220c.

The upper region 210a and 220a is a part of the pair of guide plates 210 and 220 that is adjacent to the main body 100. At least a portion of the upper region 210a and 220a may be inserted into and coupled to the main body 100.

The upper region 210a and 220a is a part of the pair of guide plates 210 and 220 that is located relatively upward and rearward.

The upper region 210a and 220a is a part of the pair of guide plates 210 and 220 that extends toward the front of the vehicle.

The upper region 210a and 220a may have a planar shape or a curved shape.

In some implementations, the upper region 210a and 220a may be parallel to a virtual horizontal plane S1. The virtual horizontal plane S1 is a virtual plane parallel to the front-rear direction (direction parallel to X) and to the left-right direction (direction parallel to Y).

In some implementations, the upper region 210a and 220a may be inclined with respect to the virtual horizontal plane S1. The closer the upper region 210a and 220a is to the front side of the vehicle, the more it may be inclined downward.

The curved region 210b and 220b extends from the upper region 210a and 220a. The curved region 210b and 220b may extend toward the front of the vehicle from the front end of the upper region 210a and 220a and then extend downward.

The closer the curved region 210b and 220b is to the front side of the vehicle, the more it may be inclined downward.

The lower region 210c and 220c extends from curved region 210b and 220b. The lower region 210c and 220c may extend from the lower end of the curved region 210b and 220b.

The lower region 210c and 220c forms a free end of the pair of guide plates 210 and 220. The lower region 210c and 220c may have a planar shape or a curved shape.

The lower region 210c and 220c may extend downward from the curved region 210b and 220b.

In some implementations, the lower region 210c and 220c may be parallel to a virtual vertical surface S2. The virtual vertical surface S2 is a virtual surface parallel to the up-down direction (direction parallel to Z) and the left-right direction (direction parallel to Y).

In some implementations, the lower region 210c and 220c may extend downward from the curved region 210b and 220b and may also extend toward the front of the vehicle. That is, the lower region 210c and 220c may be inclined with respect to the virtual vertical surface S2.

The display device 10 may be configured to switch between the first state and the second state.

The first state is a state in which the flexible display 300 is not inserted into the lower region 210c and 220c.

In some implementations, in the first state, a front end 310 of the flexible display 300 may be inserted up to the upper region 210a and 220a, but may not be inserted up to the curved region 210b and 220b.

In some implementations, in the first state, the front end 310 of the flexible display 300 may be inserted up to the curved region 210b and 220b through the upper region 210a and 220a.

The second state is a state in which the flexible display 300 is inserted up to the lower region 210c and 220c through the upper region 210a and 220a and the curved region 210b and 220b.

That is, the second state is a state in which the front end 310 of the flexible display 300 is inserted through the curved region 210b and 220b up to the lower region 210c and 220c.

As described above, the display device 10 may be configured such that the flexible display 300 is switched between the first state and the second state, where in the first state, at least a portion of the flexible display 300 may be interposed between the first guide plate 210 and the second guide plate 220. Accordingly, when the flexible display 300 is switched between the first state and the second state, the flexible display 300 may be flexibly moved along the inner surfaces 211 and 221 of the first guide plate 210 and the second guide plate 220. Accordingly, the flexible display 300 may be stably moved and deformed.

In the first state, all or substantial portions of the curved region 210b and 220b and the lower region 210c and 220c of the pair of transparent guide plates 210 and 220 may not be blocked by the flexible display 300. As a result, the flexible display 300 does not disturb the view of the occupant.

In the second state, an image may be displayed on the flexible display 300. The image displayed on the flexible display 300 may include driving information on the vehicle, a rear image of the vehicle, an interior image of the vehicle, and the like. Accordingly, in the second state, the display device 10 may function as a rear-view mirror.

Some of the images displayed on the flexible display 300 may be images captured by a camera 170 installed on the display device 10, or images captured by a separate camera installed on the outside of the vehicle.

The inner surface 211 of the first guide plate 210 and the inner surface 221 of the second guide plate 220 may have a shape in which their radii of curvature continuously decrease and then continuously increase from the upper region 210a and 220a to the lower region 210c and 220c. In some implementations, the radius of curvature (r) of the curved region 210b and 220b may be smaller than the radius of curvature of the upper region 210a and 220a and may also be smaller than the radius of curvature of the lower region 210c and 220c.

Accordingly, when the flexible display 300 moves from the upper region 210a and 220a toward the lower region 210c and 220c, the flexible display 300 may move flexibly without being excessively bent.

In the display device 10, an angle $\theta 3$ between the upper region 210a and 220a and the lower region 210c and 220c may be greater than 90° and smaller than 180° so as to minimize the load applied to the flexible display 300. In some implementations, the angle $\theta 3$ between the upper region 210a and 220a and the lower region 210c and 220c may be 120°~140°. In some implementations, the angle $\theta 3$ between the upper region 210a and 220a and the lower region 210c and 220c may be about 135°.

An angle $\theta 1$ of the upper region 210a and 220a relative to the virtual horizontal surface S1 may be 45° or less. In some implementations, the angle $\theta 1$ of the upper region 210a and 220a relative to the virtual horizontal surface S1 may be 30° or less. In some implementations, the angle $\theta 1$ of the upper region 210a and 220a relative to the virtual horizontal plane S1 may be 10°~30°, particularly about 20°.

An angle $\theta 2$ of the lower region 210c and 220c relative to the virtual vertical surface S2 may be 45° or less. In some implementations, the angle $\theta 2$ of the lower region 210c and 220c relative to the virtual vertical surface S2 may be 30° or less, particularly 10°~25°, more particularly about 20°.

The guide frame 230 is coupled to the edges of the pair of guide plates 210 and 220 so as to support the pair of guide plates 210 and 220. The guide frame 230 is coupled to left edges 212 and 222, right edges 213 and 223, and lower edges 214 and 224 of the pair of guide plates 210 and 220 (see FIGS. 4 and 5).

The flexible display 300 is inserted through upper edges 215 and 225 of the pair of guide plates 210 and 220 (edges coupled to the main body 100). However, the guide frame 230 is not coupled to the upper edges 215 and 225 of the pair of guide plates 210 and 220.

The guide frame 230 is fixed to the main body 100. Rear ends 231 and 232 of the guide frame 230 may be fixed to a fixing bracket 600, which will be described below, or may be fixed by fastening means such as bolts.

The display device 10 may include a moving body 500 and an actuator 700. In addition, the display device 10 includes a controller 400 and a flexible printed circuit board (FPCB) 410.

The moving body 500 may be provided inside the main body 100.

The moving body 500 supports the rear portion 320 of the flexible display 300. The rear portion 320 of the flexible display 300 may be fixed to the moving body 500. The moving body 500 may be made of an insulator such as plastic. For example, the moving body 500 may have a plate shape or a block shape that extends across the rear portion 320 of the flexible display 300.

The moving body 500 may be coupled to the flexible display 300 so as to overlap the upper surface of the flexible display 300. Specifically, since the rear portion 320 of the flexible display 300 is bent in a U shape, the rear portion 320 may be fixed to the upper surface of the moving body 500.

The moving body 500 may be configured to reciprocate relative to the main body 100 through a sliding movement. For example, as the moving body 500 moves relative to the main body 100, the flexible display 300 also moves relative to the main body 100. As a result, the switching between the first state and the second state of the flexible display 300 is performed.

The actuator 700 may be provided inside the main body 100 to move the moving body 500. Under the operation of the actuator 700, the moving body 500 reciprocates relative to the main body 100.

The controller 400 is installed inside the main body 100 to control the flexible display 300. The controller 400 may be configured to control the overall operation of the display device 10. The controller 400 may include a microprocessor and a memory (e.g., a non-transitory memory device). The controller 400 may process signals, data, information, and the like that are inputted or outputted through components of the display device 10, or execute an application program stored in the memory, thereby providing information or functions appropriate to the occupant. The controller 400 may include an electric circuit.

Under the control of the controller 400, the flexible display 300 may display image information.

The controller 400 may be configured in the form of a printed circuit board (PCB).

The flexible printed circuit board (FPCB) 410 may be, for example, a typical flexible printed circuit board (FPCB), and may connect the flexible display 300 to the controller 400. That is, the flexible printed circuit board 410 may connect the flexible display 300 to the controller 400 such that the operation (image displaying operation, and the like) of the flexible display 300 is performed under the control of the controller 400.

The flexible printed circuit board 410 may be or include a thin elastic film as a whole, and may be bent in a U shape. The flexible printed circuit board 410 is deformed in shape according to the operation (the switching operation between the first state and the second state) of the display device 10.

The flexible printed circuit board 410 may be divided into a first flexible region 411, a second flexible region 412, and a third flexible region 413.

The first flexible region 411 may be a region connected to the flexible display 300 via the moving body 500. The first flexible region 411 is a region that is located relatively low among regions of the flexible printed circuit board 410 bent in a U shape.

The second flexible region 412 may be located over the first flexible region 411 and is connected to the controller 400.

The third flexible region 413 may be a curved portion that is bent in a U shape, which connects the first flexible region 411 and the second flexible region 412.

In the display device 10, according to the switching between the first state and the second state, the size of each of the first flexible region 411 and the second flexible region 412 may vary, and the size and position of the third flexible region 413 may also vary.

In the display device 10, the flexible printed circuit board 410 may be configured as described above, thereby reducing the overall length of the flexible printed circuit board 410. In addition, when the display device 10 is switched between the first state and the second state, the flexible printed circuit board 410 may be deformed in shape within a predictable range, thereby avoiding interference with other components.

Furthermore, since the controller 400 is configured not to move together with the flexible display 300 and the moving body 500, the load of the actuator 700 may be reduced, and power consumed when switching the flexible display 300 may be minimized.

In some implementations, the display device 10 may include a driving detection sensor 150.

The driving detection sensor 150 is configured to detect a state of a driver. That is, the driving detection sensor 150 may be configured as, for example, an image sensor or a camera so as to detect the appearance and state of the occupant.

The controller 400 may be configured to control the flexible display 300 and the actuator 700 according to a driving state of the vehicle or according to a signal from the driving detection sensor 150.

The vehicle may be operated by manual driving (direct driving operation by the occupant) or autonomous driving.

When manual driving is performed by the occupant, the display device 10 may be in a second state, in which an image may be displayed on the flexible display 300.

When autonomous driving of the vehicle is performed, the display device 10 may be in a first state.

When a carelessness of the occupant (for example, a case in which the occupant does not properly keep his or her eyes on the road in front of the vehicle) is detected by the driving detection sensor 150, the display device 10 may be switched from the first state to the second state, and provide a warning image to the occupant through the flexible display 300.

When a dangerous situation is detected by a camera or a sensor installed in the vehicle (for example, when the approach speed of a following vehicle exceeds a reference value, or when the distance to a preceding vehicle is less than a reference value), the display device 10 may notify the occupant of the dangerous situation through the flexible display 300 in the second state.

In the display device 10, the flexible display 300 may be configured as a transparent display. Accordingly, the image may be displayed toward the occupant in the interior of the vehicle through the flexible display 300. In addition, the image may be provided to pedestrians outside the vehicle through the flexible display 300.

Figure 4:
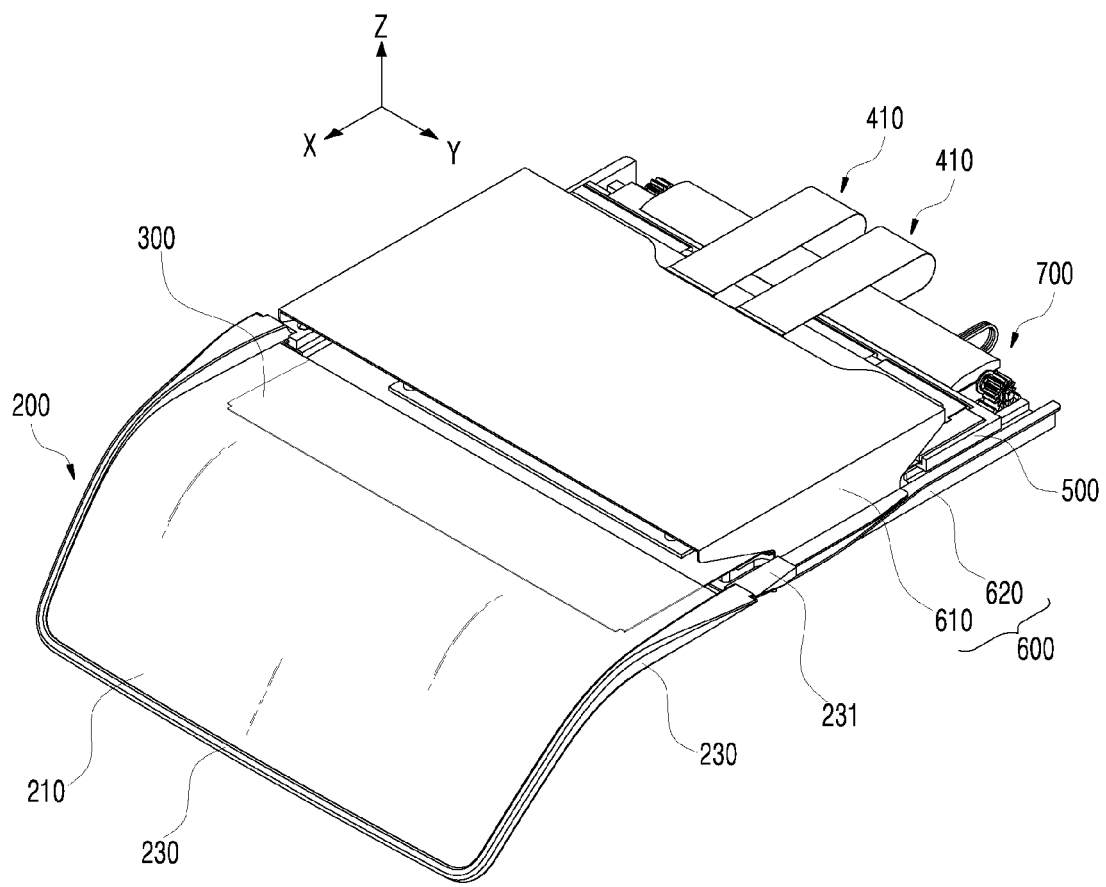
FIG. 4 is a perspective view illustrating an example of a display device for a vehicle in an example of a first state.
Figure 5:
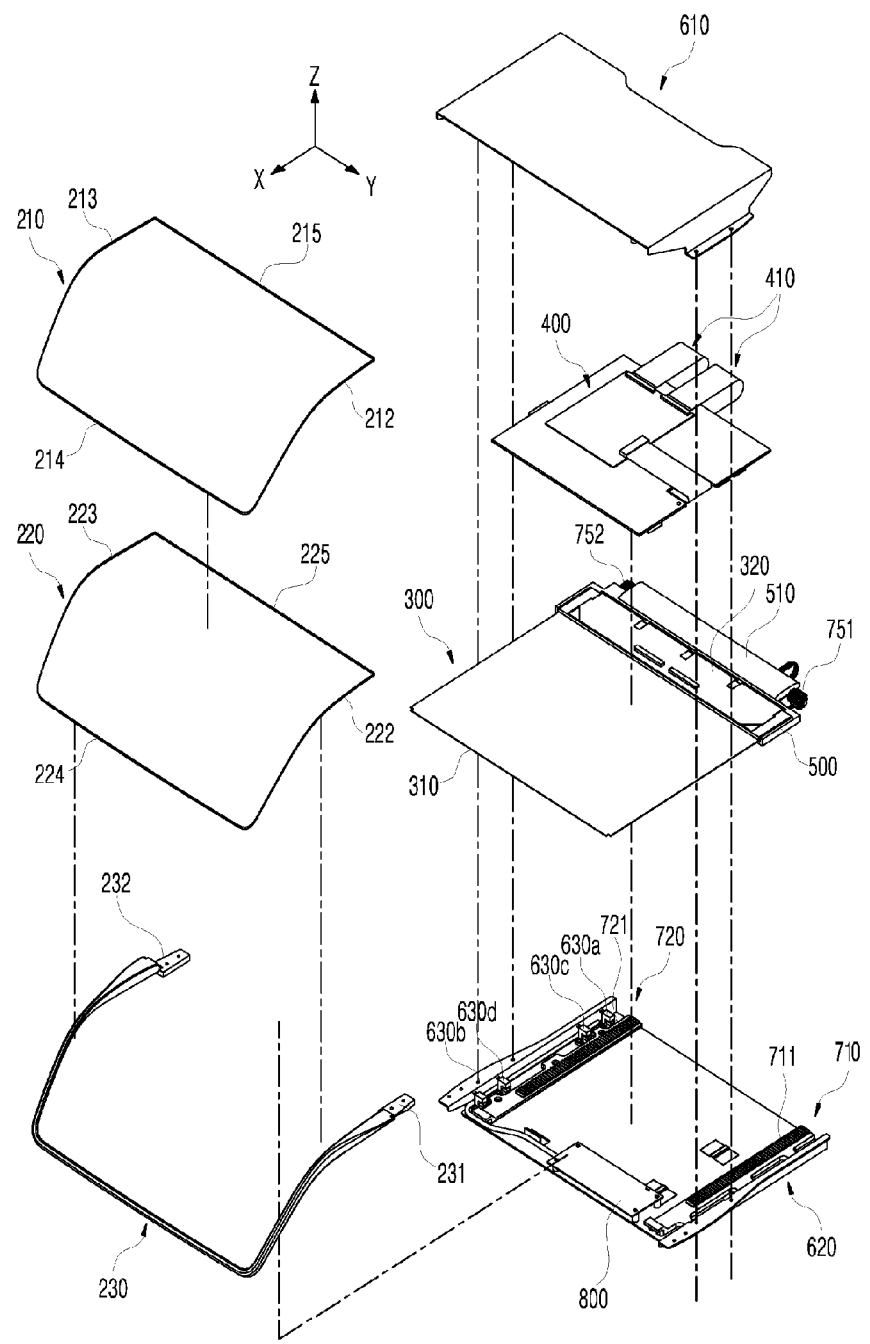
FIG. 5 is an exploded perspective view illustrating the display device shown in FIG. 4.
Figure 6:
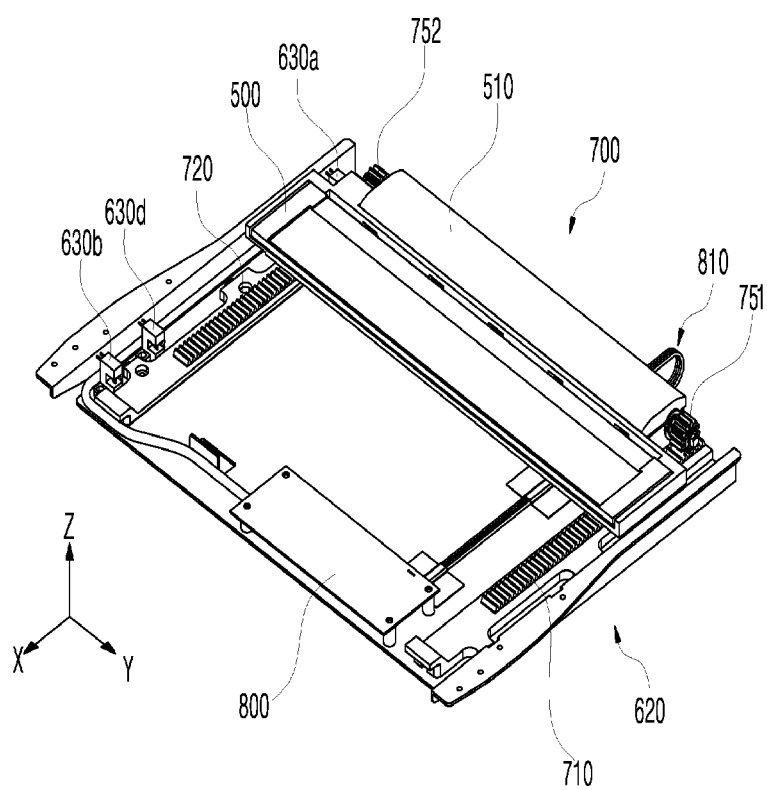
FIG. 6 is a perspective view illustrating example components of the display device shown in FIG. 4.

FIG. 4 is a perspective view illustrating the display device 10. FIG. 5 is an exploded perspective view illustrating the display device 10 shown in FIG. 4. FIG. 6 is a perspective view illustrating example components of the display device 10 shown in FIG. 4.

The fixing bracket 600 is provided inside the main body 100 and fixed to the main body 100.

The fixing bracket 600 is configured to support other components of the display device 10.

The fixing bracket 600 may be divided into an upper bracket 610 and a lower bracket 620. Each of the upper bracket 610 and the lower bracket 620 may be formed by plastic working of a metal plate.

The lower bracket 620 and the upper bracket 610 may be formed in the form of a plate having a predetermined area. In addition, central portions of the lower bracket 620 and the upper bracket 610 may be spaced apart from each other to form a space. Various components constituting the display device 10 may be provided in the space between the lower bracket 620 and the upper bracket 610 to be coupled to the lower bracket 620 and the upper bracket 610.

The controller 400 may be fixed to the bottom of the upper bracket 610.

The moving body 500 is configured to reciprocate back and forth between the lower bracket 620 and the upper bracket 610.

The actuator 700 may include gear racks 710 and 720, a motor 730, and a gear 755.

The gear racks 710 and 720 extend along a direction parallel to the upper region 210a and 220a. Gears 711 and 712 are formed in the gear racks 710 and 720 along the longitudinal direction of the gear racks 710 and 720.

The motor 730 may be a typical motor, and is fixed to the moving body 500. The motor 730 may be equipped with a gearbox for deceleration.

There may be more than one gear 755. The gear 755 rotates in interlock with gear racks 710 and 720 by the operation of motor 730. Accordingly, when the motor 730 is operated, relative movement is performed between the moving body 500 and the gear racks 710 and 720.

Figure 7:
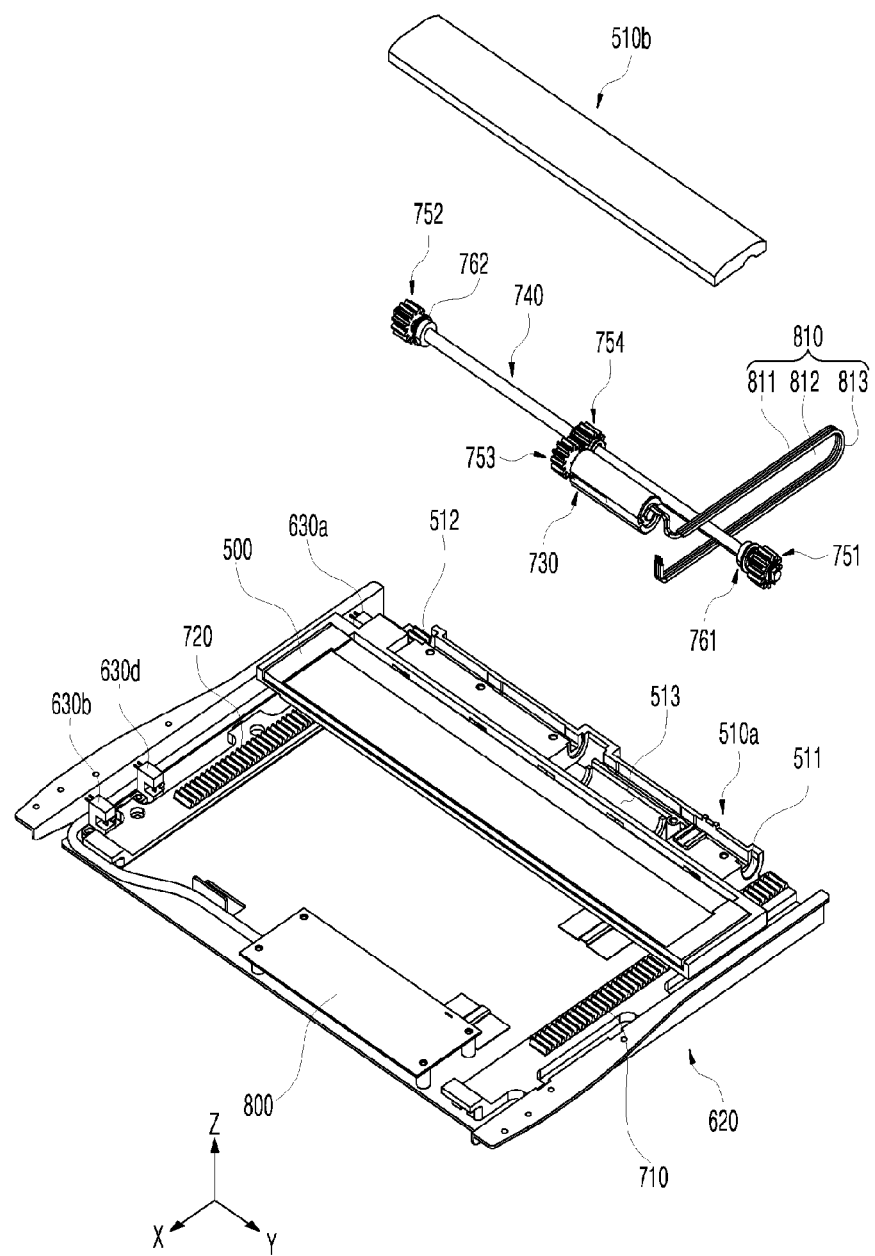
FIG. 7 is a perspective view separately illustrating the components of the display device shown in FIG. 6.
Figure 8:
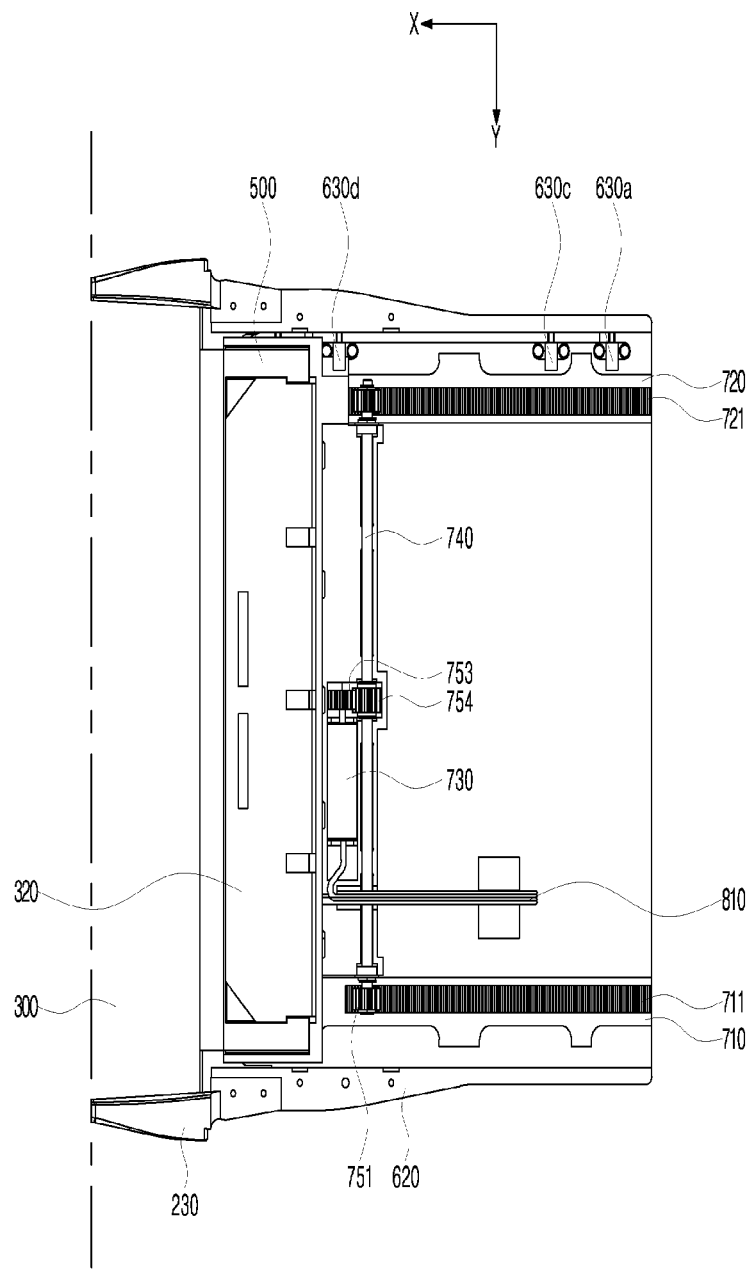
FIG. 8 is a plan view illustrating some components of the display device shown in FIG. 4 when the display device is in an example of a second state.
Figure 9:
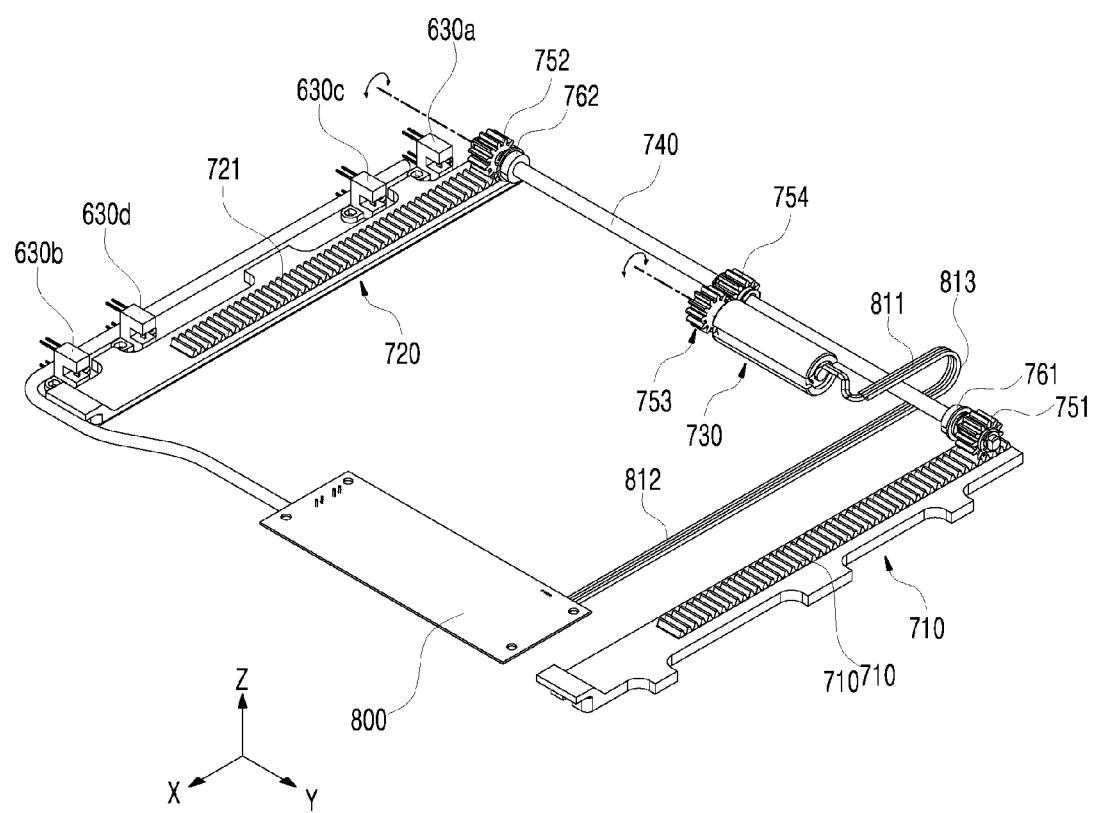
FIG. 9 is a perspective view illustrating example components of the display device shown in FIG. 4.

FIG. 7 is a perspective view separately illustrating example components of the display device 10 shown in FIG. 6. FIG. 8 is a plan view illustrating example components of the display device 10 shown in FIG. 4. FIG. 9 is a perspective view illustrating example components of the display device 10 shown in FIG. 4.

In some implementations, the actuator 700 may include a first gear rack 710, a second gear rack 720, a first gear 751, a second gear 752, a drive shaft 740, a third gear 754, and a motor 730.

In some examples, the display device 10 may include a first bearing 761, a second bearing 762, and a motor casing 510.

The first gear rack 710 extends along the direction parallel to the upper region 210a and 220a. The gear 711 is repeatedly formed in the first gear rack 710 along the longitudinal direction of the first gear rack 710. In addition, the gear 711 of the first gear rack 710 is repeatedly formed along the direction parallel to the upper region 210a and 220a.

The second gear rack 720 and the first gear rack 710 are spaced apart to be side by side with each other. In other words, the first gear rack 710 and the second gear rack 720 are spaced apart in parallel to each other. In addition, the second gear rack 720 extends along the direction parallel to the upper region 210a and 220a. The gear 721 is repeatedly formed in the second gear rack 720 along the longitudinal direction of the second gear rack 720. Further, the gear 721 in the second gear rack 720 is repeatedly formed along the direction parallel to the upper region 210a and 220a.

The motor casing 510 is configured to receive and fix the motor 730 and some components of the actuator 700 therein. The motor casing 510 is fixed to the moving body 500.

The motor casing 510 may be divided into a lower casing 510a and an upper casing 510b, which are coupled to each other. The lower casing 510a forms a lower portion of the motor casing 510, and the upper casing 510b forms an upper portion of the motor casing 510. The lower casing 510a and the upper casing 510b are assembled to form the motor casing 510.

The lower casing 510a may be fixed to the moving body 500 and integrally formed with the moving body 500.

The motor casing 510 includes a first seating part 511, a second seating part 512, and a receiving space 513.

The receiving space 513 may be formed in the form of a recess in the inner side of the motor casing 510. The motor 730, the drive shaft 740, the third gear 754, and the fourth gear 753 are received in this receiving space 513. The motor 730 is fixed inside the receiving space 513. The drive shaft 740, the third gear 754, and the fourth gear 753 are rotatably fixed in the receiving space 513.

The first seating part 511 and the second seating part 512 are also formed in the form of recesses in the inner side of the motor casing 510. Each of the first seating part 511 and the second seating part 512 has a circular recessed surface. When the receiving space 513 is formed at the central portion of the motor casing 510, the first seating part 511 and the second seating part 512 are formed at both ends of the motor casing 510.

When the first seating part 511 forms the left end of the motor casing 510, the second seating part 512 forms the right end of the motor casing 510.

The first gear 751 is located outside the motor casing 510 and rotates in interlock with the gear 711 of the first gear rack 710.

The second gear 752 is located outside the motor casing 510 and rotates in interlock with the gear 721 of the second gear rack 720. The axis of rotation of the second gear 752 and the axis of rotation of the first gear 751 are collinear with each other. The first gear 751 and the second gear 752 may be arranged outside the left and right sides of the motor casing 510.

The drive shaft 740 extends in the form of an elongated rod along the left-right direction and connects the first gear 751 and the second gear 752. The first gear 751 and the second gear 752 are fixed on the drive shaft 740. The drive shaft 740 forms the rotation axes of the first gear 751 and the second gear 752.

The first gear 751 and the second gear 752 are symmetrical to each other with respect to the drive shaft 740.

Most of the drive shaft 740 is received inside the motor casing 510, and both ends of the drive shaft 740 protrude from the motor casing 510.

The motor 730 is configured to rotate the third gear 754. The fourth gear 753 may be coupled to a rotation axis of the motor 730, and the fourth gear 753 rotates in interlock with the third gear 754.

The third gear 754 is fixedly coupled to the center of the drive shaft 740. The drive shaft 740 forms a rotation axis of the third gear 754. The third gear 754 may be fixedly coupled to the center of the drive shaft 740.

The motor 730, the fourth gear 753, and the third gear 754 are received inside the motor casing 510.

The first bearing 761 is fixedly coupled to the drive shaft 740 at a position adjacent to the first gear 751.

The second bearing 762 is fixedly coupled to the drive shaft 740 at a position adjacent to the second gear 752. The first bearing 761 and the second bearing 762 may be symmetrical with respect to the drive shaft 740.

The first bearing 761 and the second bearing 762 may be formed of lubricious engineering plastics or acetals. Accordingly, frictional force between the first bearing 761 and the motor casing 510 may be reduced, and frictional force between the second bearing 762 and the motor casing 510 may also be reduced.

The first bearing 761 is seated on and supported by the first seating part 511 of the motor casing 510. The second bearing 762 is seated on and supported by the second seating part 512 of the motor casing 510. In this state, the driving shaft 740 may be rotated. For instance, the first seating part 511 and the second seating part 512 may be a groove or a recess.

The display device 10 may include a motor controller 800 and a motor cable 810.

The motor controller 800 is configured to control the operation of the motor 730 and is provided inside the main body 100. The motor controller 800 may include a printed circuit board (PCB). The motor controller 800 may be provided between the lower bracket 620 and the upper bracket 610 and be fixed to the upper surface of the lower bracket 620.

Under control of the motor controller 800, the motor 730 may be rotated, the rotation direction of the motor 730 may be switched, and the rotation speed of the motor 730 may be changed.

The motor cable 810 may be configured with electric wires, and connects the motor 730 to the motor controller 800.

The motor cable 810 may be divided into a first cable region 811, a second cable region 812, and a third cable region 813.

The first cable region 811 is located above the driving shaft 740 and is connected to the motor 730. The first cable region 811 may be a region that is located relatively high among regions of the motor cable 810 bent in a U shape.

The second cable region 812 is located under the driving shaft 740 and is connected to the motor controller 800.

The third cable region 813 is a curved region bent in a U shape and connects the first cable region 811 to the second cable region 812.

In the display device 10, according to the switching between the first state and the second state, the size of each of the first cable region 811 and the second cable region 812 may vary, and the size and position of the third cable region 813 may vary.

Figure 10A:
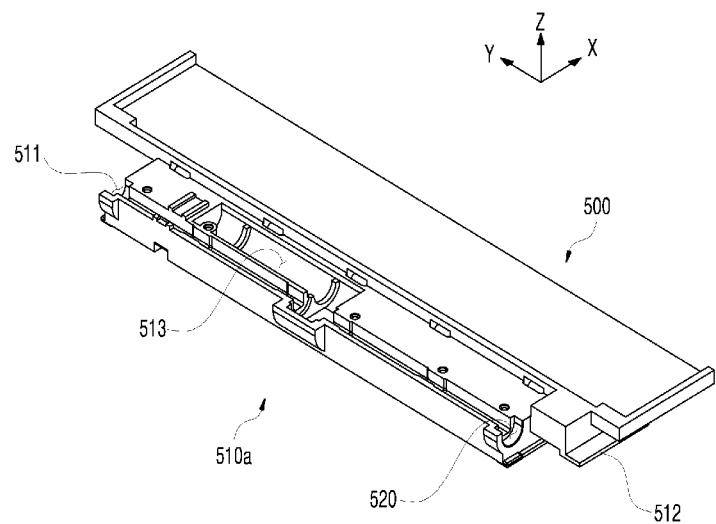
FIG. 10A is a perspective view illustrating example components of the display device shown in FIG. 4.
Figure 10B:
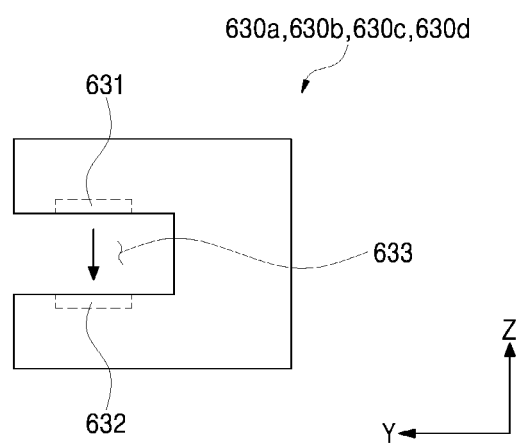
FIG. 10B is a diagram schematically illustrating an example of a sensor included in a display device for a vehicle.
Figure 10C:
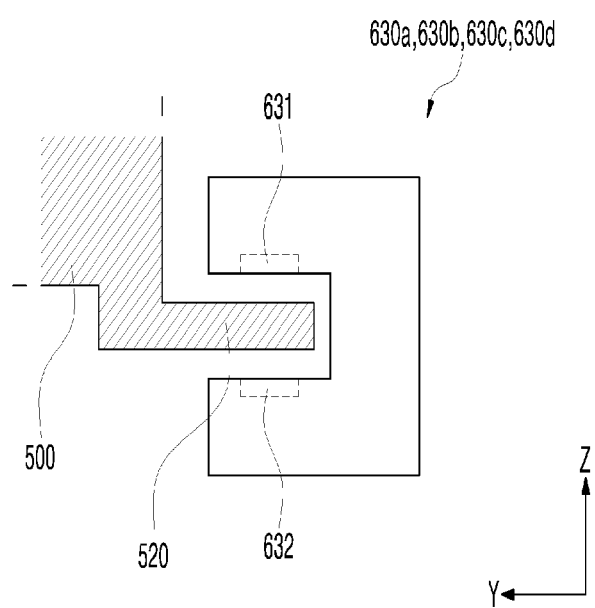
FIG. 10C is a diagram illustrating an example of a moving body and the sensor shown in FIG. 10B.

FIG. 10A is a perspective view illustrating some components of the display device 10 shown in FIG. 4. FIG. 10B is a diagram schematically illustrating a first sensor 630a, a second sensor 630b, a third sensor 630c, and a fourth sensor 630d that are included in the display device 10. FIG. 10C is a diagram illustrating an aspect in which the moving body 500 is detected using the first sensor 630a, the second sensor 630b, the third sensor 630c, and the fourth sensor 630d.

The display device 10 may include a first sensor 630a and a second sensor 630b. In addition, the display device 10 may further include a third sensor 630c and a fourth sensor 630d.

Each of the first sensor 630a, the second sensor 630b, the third sensor 630c, and the fourth sensor 630d may be installed on the fixing bracket 600 so as to detect the position of the moving body 500. The first sensor 630a, the second sensor 630b, the third sensor 630c, and the fourth sensor 630d may be fixed to the lower bracket 620.

The first sensor 630a, the second sensor 630b, the third sensor 630c, and the fourth sensor 630d may be arranged in a line along the direction parallel to the upper region 210a and 220a.

The first sensor 630a may be installed on the fixing bracket 600 at a relatively rear side. The first sensor 630a may be a rearmost sensor of the four sensors.

The second sensor 630b may be installed on the fixing bracket 600 in front of the first sensor 630a. The second sensor 630b may be a foremost sensor of the four sensors.

The distance between the first sensor 630a and the second sensor 630b may be sufficiently larger than the width in the front-rear direction of the moving body 500.

The third sensor 630c is installed on the fixing bracket 600 between the first sensor 630a and the second sensor 630b.

The distance between the first sensor 630a and the third sensor 630c may be smaller than the width in the front-rear direction of the moving body 500.

The fourth sensor 630d is installed on the fixing bracket 600 between the second sensor 630b and the third sensor 630c.

The distance between the second sensor 630b and the fourth sensor 630d may be smaller than the width in the front-rear direction of the moving body 500. In addition, the distance between the third sensor 630c and the fourth sensor 630d may be greater than the width in the front-rear direction of the moving body 500.

In some implementations, the rotation of the motor 730 may be controlled according to a signal detected by the first sensor 630a, and may also be controlled according to a signal detected by the second sensor 630b.

In some implementations, the rotational speed of the motor 730 may be decelerated according to a signal detected by the third sensor 630c, and may also be decelerated according to a signal detected by the fourth sensor 630d.

Each of the first sensor 630a, the second sensor 630b, the third sensor 630c, and the fourth sensor 630d may include a light emitter 631 for emitting light, and a light receiver 632 on which light from the light emitter 631 is incident. Light emitted from the light emitter 631 is incident on the light receiver 632 when there are no other obstacles.

The moving body 500 includes a wing 520 moving between the light emitter 631 and the light receiver 632. The wing 520 may be located at the right end of the moving body 500. As the moving body 500 slidingly moves forward and backward, the moving body 500 may enter a space 633 between the light emitter 631 and the light receiver 632 of each of the first sensor 630a, the second sensor 630b, the third sensor 630c, and the fourth sensor 630d.

In some implementations, when, as the wing 520 of the moving body 500 enters the space 633 between the light emitter 631 and the light receiver 632 of the first sensor 630a, the light from the light emitter 631 of the first sensor 630a is not detected by the light receiver 632 of the first sensor 630a, the motor controller 800 may control the motor 730 such that the rotation of the motor 730 is stopped.

In addition, in some implementations, when, as the wing 520 of the moving body 500 enters the space 633 between the light emitter 631 and the light receiver 632 of the second sensor 630b, the light from the light emitter 631 of the second sensor 630b is not detected by the light receiver 632 of the second sensor 630b, the motor controller 800 may control the motor 730 such that the rotation of the motor 730 is stopped.

Furthermore, in some implementations, when, as the wing 520 of the moving body 500 enters the space 633 between the light emitter 631 and the light receiver 632 of the third sensor 630c, the light from the light emitter 631 of the third sensor 630c is not detected by the light receiver 632 of the third sensor 630c, the motor controller 800 may control the motor 730 such that the rotation speed of the motor 730 is decelerated.

Furthermore, in some implementations, when, as the wing 520 of the moving body 500 enters the space 633 between the light emitter 631 and the light receiver 632 of the fourth sensor 630d, the light from the light emitter 631 of the fourth sensor 630d is not detected by the light receiver 632 of the fourth sensor 630d, the motor controller 800 may control the motor 730 such that the rotation speed of the motor 730 is decelerated.

In the first state of the display device 10, the moving body 500 may be located at a relatively rearmost position. When, as the motor 730 rotates such that the display device 10 is switched from the first state to the second state, the moving body 500 moves forward, the wing 520 of the moving body 500 may enter between the light emitter 631 and the light receiver 632 of the fourth sensor 630d, thereby decelerating the motor 730. Then, when, as the moving body 500 moves further forward, the wing 520 of the moving body 500 enters between the light emitter 631 and the light receiver 632 of the second sensor 630b, the rotation of the motor 730 may be stopped.

In the second state of the display device 10, the moving body 500 may be located at a relatively foremost position. When, as the motor 730 rotates so that the display device 10 is switched from the second state to the first state (that is, as the motor 730 rotates in a direction opposite to the rotation direction of the motor 730 when the display device 10 is switched from the first state to the second state), the moving body 500 moves backward, the wing 520 of the moving body 500 may enter between the light emitter 631 and the light receiver 632 of the third sensor 630c, thereby decelerating the motor 730. Then, when, as the moving body 500 moves further backward, the wing 520 of the moving body 500 enters between the light emitter 631 and the light receiver 632 of the first sensor 630a, the rotation of the motor 730 may be stopped.

Figure 11A:
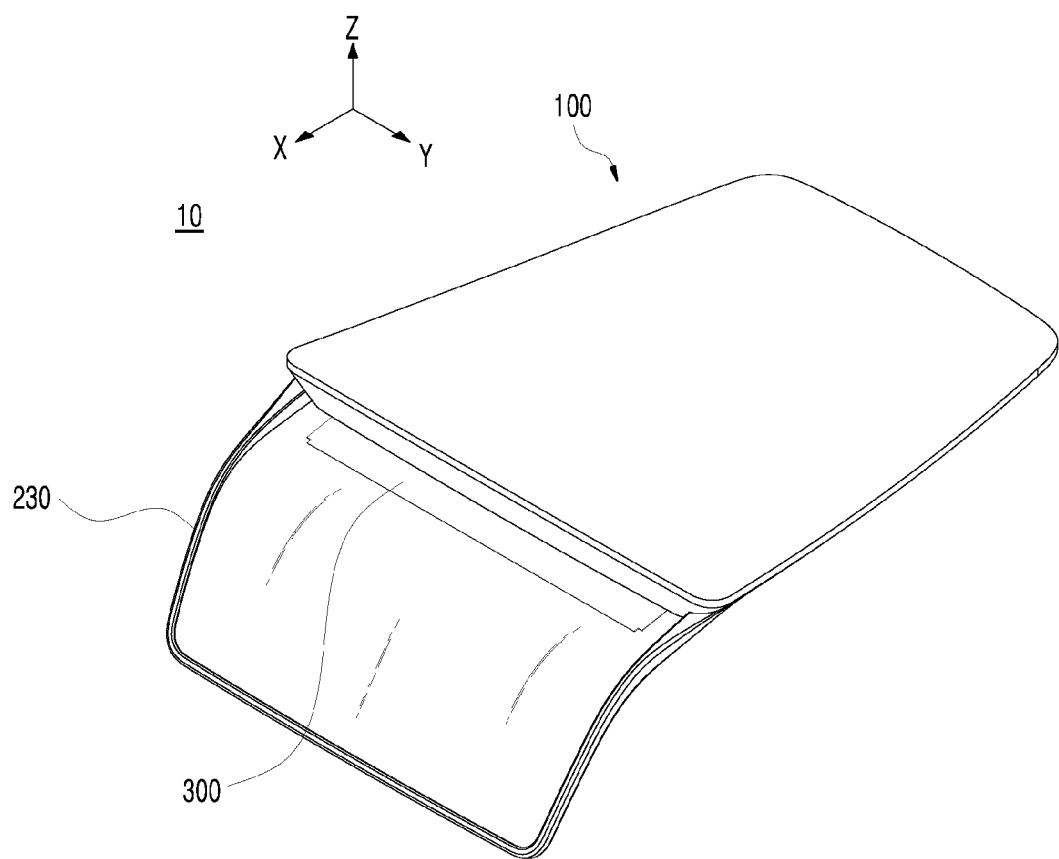
FIG. 11A is a perspective view illustrating an example of a first state of an example of a display device for a vehicle.
Figure 11B:
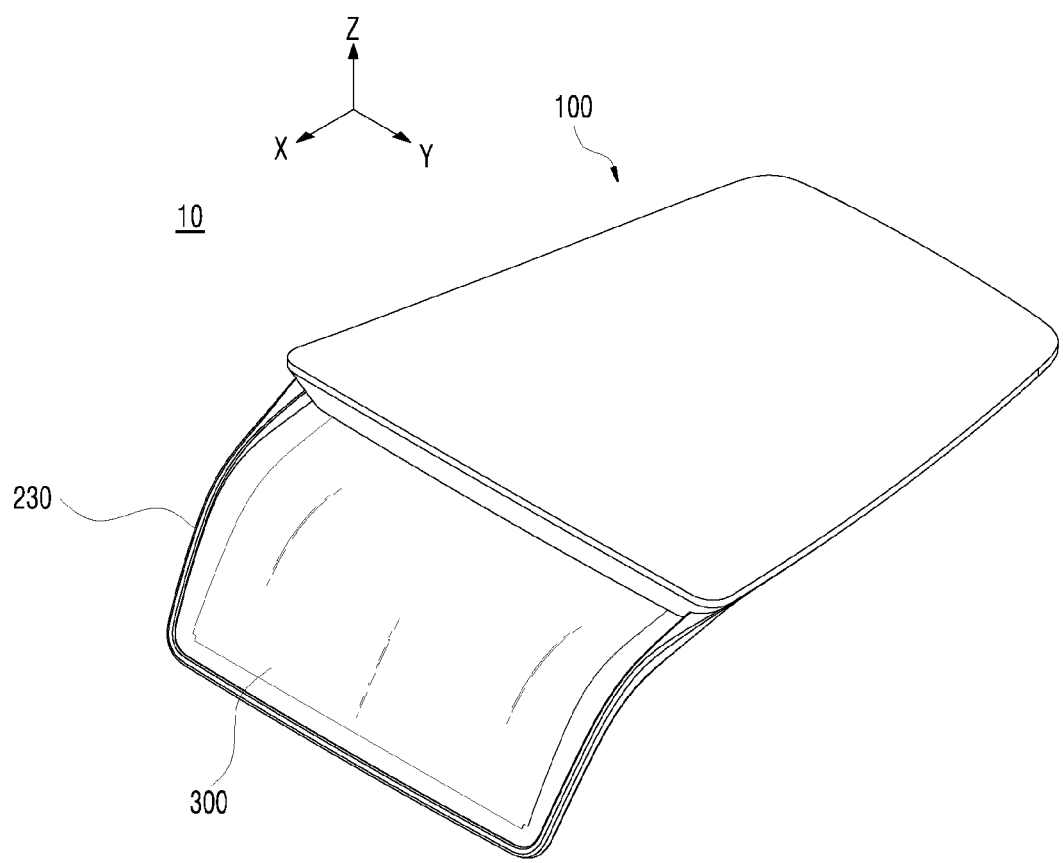
FIG. 11B is a perspective view illustrating the display device of FIG. 11A switched to an example of a second state.

FIG. 11A is a perspective view illustrating the first state of the display device 10. FIG. 11B is a perspective view illustrating an example of the display device 10 in FIG. 11A that has been switched to the second state.

Figure 12A:
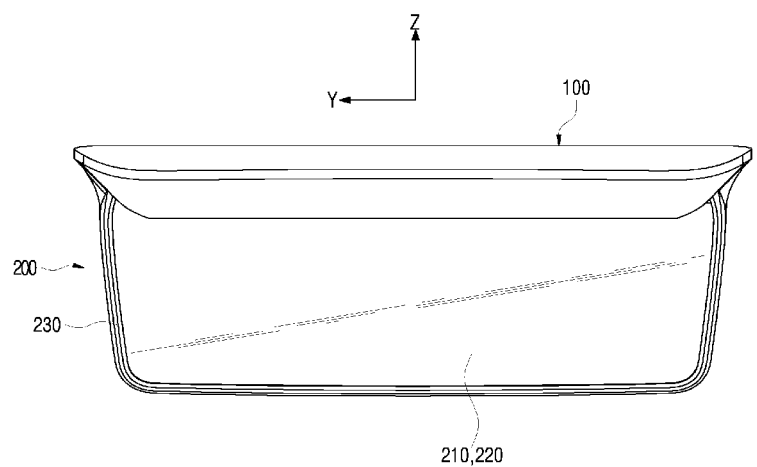
FIG. 12A is a diagram illustrating an example of a first state of a display device viewed from an inside of the vehicle.
Figure 12B:
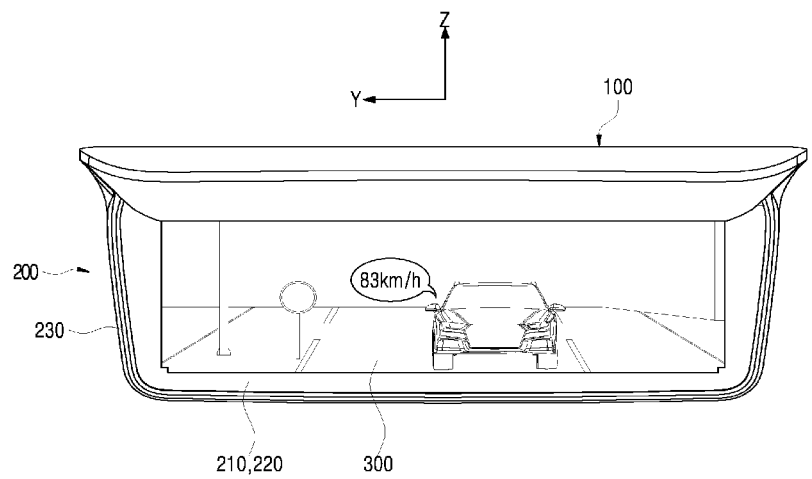
FIG. 12B is a diagram illustrating the display device of FIG. 12A switched to an example of a second state.

FIG. 12A is a diagram illustrating the first state when the display device 10 is viewed from the inside of the vehicle. FIG. 12B is a diagram illustrating an example of the display device 10 in FIG. 12A that has been switched to the second state.

The display device 10 may be in a first state where a substantial portion of the pair of transparent guide plates 210 and 220 may not overlap with the flexible display 300, and the entire portion of the lower region 210c and 220c of the pair of guide plates 210 and 220 may not overlap with the flexible display 300. Accordingly, the pair of guide plates 210 and 220 and the flexible display 300 do not block or obstruct the view of the occupant.

The display device 10 may be in a second state where most of the pair of transparent guide plates 210 and 220 may overlap with the flexible display 300. In such a case, an image may be displayed on the flexible display 300. That is, an image of the outside of the vehicle (such as an image of a following vehicle) or an image of the inside of the vehicle that is captured by the camera may be displayed on the flexible display 300.

Accordingly, the driving situation may be checked through the flexible display 300. In addition, the pair of guide plates 210 and 220 may protect the both sides of the flexible display 300 to help to prevent damage to the flexible display 300, and the pair of guide plates 210 and 220 may guide the flexible display such that the flexible display move flexibly.

Although the present disclosure has been described with reference to particular implementations, it is to be understood that these implementations are merely illustrative of the principles and applications of the present disclosure. It will be apparent to those skilled in the art that various modifications and variations may be made to the method and apparatus of the present disclosure without departing from the spirit and scope of the present disclosure. Thus, it is intended that the present disclosure include modifications and variations that are within the scope of the appended claims and their equivalents.

In some implementations, the display device allows a situation in front of the vehicle to be observed through the transparent guide plates and allows a situation behind the vehicle to be observed through the flexible display. The flexible display may be protected and deformed by the pair of guide plates. The present disclosure may have industrial applicability.

What is claimed is:

1. A display device for a vehicle, comprising:
    a main body configured to be fixed to the vehicle and disposed at a position adjacent to an upper portion of a windshield of the vehicle;
    a guide having an upper portion coupled to the main body, the guide comprising a pair of guide plates that are spaced apart from each other and face each other; and
    a flexible display configured to extend through a space between the pair of guide plates to thereby vary an area of the flexible display positioned between the pair of guide plates,
    wherein at least a portion of the pair of guide plates is transparent.

2. The display device according to claim 1, wherein each of the pair of guide plates comprises:
    an upper region that extends toward a front of the vehicle;
    a curved region that extends from the upper region toward the front of the vehicle, the curved region being curved downward relative to the upper region; and
    a lower region that extends downward from the curved region, and
    wherein the flexible display is configured to move between a first state in which the flexible display is retracted from the lower region and a second state in which the flexible display is inserted into the lower region through the upper region and the curved region.

3. The display device according to claim 2, wherein an angle between the upper region and the lower region is greater than 90° and less than 180°.

4. The display device according to claim 2, wherein an angle of the upper region relative to a horizontal plane is 45° or less; and
    wherein an angle of the lower region relative to a vertical plane is 45° or less.

5. The display device according to claim 2, wherein a radius of curvature of the curved region is less than a radius of curvature of each of the upper region and the lower region.

6. The display device according to claim 1, wherein the pair of guide plates are made of transparent glass or transparent plastic.

7. The display device according to claim 1, wherein the pair of guide plates are parallel to each other and extend along a left-right direction of the main body.

8. The display device according to claim 1, wherein the guide further comprises a guide frame fixed to the main body and coupled to left edges, right edges, and lower edges of the pair of guide plates.

9. A display device for a vehicle, comprising:
    a main body configured to be fixed to a frame of the vehicle that supports a windshield of the vehicle;
    a pair of guide plates that are spaced apart from each other and face each other, each of the pair of guide plates including an upper region and a lower region disposed vertically below the upper region;
    a guide frame coupled to edges of the pair of guide plates and fixed to the main body;
    a flexible display configured to extend, through a space between the pair of guide plates, to the upper region or the lower region of the pair of guide plates;
    a moving body that supports the flexible display and is configured to move the flexible display relative to the main body; and
    an actuator configured to move the moving body.

10. The display device according to claim 9, further comprising:
    a controller disposed inside the main body and configured to control the flexible display; and
    a flexible printed circuit board that connects the flexible display and the controller to each other, wherein the flexible printed circuit board comprises:
a first flexible region connected to the flexible display through the moving body;
a second flexible region located vertically above the first flexible region and connected to the controller; and
a third flexible region that is curved and connects the first flexible region to the second flexible region.

11. The display device according to claim 9, wherein the actuator comprises:
a gear rack that extends along a direction parallel to the upper region;
at least one gear engaged with the gear rack; and
a motor fixed to the moving body and configured to rotate the at least one gear.

12. The display device according to claim 11, further comprising:
a fixing bracket fixed to the main body;
a first sensor disposed at the fixed bracket and configured to detect a position of the moving body; and
a second sensor that is disposed at the fixing bracket, that is disposed forward relative to the first sensor, and that is configured to detect the position of the moving body,
wherein the motor is configured to be controlled based on a signal detected by the first sensor or by the second sensor.

13. The display device according to claim 12, further comprising:
a third sensor disposed at the fixing bracket between the first sensor and the second sensor, the third sensor being configured to detect the position of the moving body; and
a fourth sensor disposed at the fixing bracket between the second sensor and the third sensor, the fourth sensor being configured to detect the position of the moving body,
wherein the motor is configured to decelerate a rotation speed of the motor based on a signal detected by the third sensor or by the fourth sensor.

14. The display device according to claim 13, wherein each of the first sensor, the second sensor, the third sensor, and the fourth sensor comprises:
a light emitter configured to emit light; and
a light receiver configured to receive the light emitted from the light emitter, and
wherein the moving body comprises a wing configured to move between the light emitter and the light receiver.

15. The display device according to claim 9, wherein the actuator comprises:
a first gear rack that extends along a direction parallel to the upper region;
a second gear rack that is spaced apart from the first gear rack and extends in parallel to the first gear rack;
a first gear engaged with the first gear rack;
a second gear engaged with the second gear rack;
a drive shaft that defines rotation axes of the first gear and the second gear;
a third gear coupled to the drive shaft and disposed between the first gear and the second gear; and
a motor fixed to the moving body and configured to rotate the third gear.

16. The display device according to claim 15, further comprising:
a first bearing disposed adjacent to the first gear and coupled to the drive shaft;
a second bearing disposed adjacent to the second gear and coupled to the drive shaft; and
a motor casing that defines a first seating part that supports the first bearing, a second seating part that supports the second bearing, and a receiving space that receives the motor and the third gear.

17. The display device according to claim 15, further comprising:
a motor controller disposed in the main body; and
a motor cable that connects the motor to the motor controller,
wherein the motor cable comprises:
a first cable region located vertically above the drive shaft,
a second cable region located vertically below the drive shaft, and
a third cable region that is curved and connects the first cable region to the second cable region.

18. A display device for a vehicle, comprising:
a main body configured to be fixed to the vehicle and configured to be disposed at a position adjacent to an upper portion of a windshield of the vehicle;
a pair of guide plates that are transparent, that extend downward from the main body, and that are spaced apart from each other and face each other;
a flexible display configured to extend through a space between the pair of guide plates to thereby vary an area of the flexible display overlapping with the pair of guide plates;
an actuator configured to move the flexible display;
a driving detection sensor configured to detect a driver of the vehicle; and
a controller configured to control the flexible display and the actuator based on a driving state of the vehicle or a signal from the driving detection sensor.

19. The display device according to claim 18, wherein at least a portion of the pair of guide plates has a curved shape, and
wherein the display device further comprises a guide frame that is coupled to left edges, right edges, and lower edges of the pair of guide plates.

20. The display device according to claim 18, wherein the flexible display is a transparent display.

* * * * *